(12) United States Patent
Widmer et al.

(10) Patent No.: US 10,893,604 B1
(45) Date of Patent: Jan. 12, 2021

(54) POTTED PRINTED CIRCUIT BOARD MODULE AND METHODS THEREOF

(71) Applicant: GOODRICH CORPORATION, Charlotte, NC (US)

(72) Inventors: Jonathan L. Widmer, Jud, ND (US); Wesley K. Stegmiller, Jamestown, ND (US)

(73) Assignee: Goodrich Corporation, Charlotte, NC (US)

(*) Notice: Subject to any disclaimer, the term of this patent is extended or adjusted under 35 U.S.C. 154(b) by 0 days.

(21) Appl. No.: 16/807,680

(22) Filed: Mar. 3, 2020

(51) Int. Cl.
| | |
|---|---|
| *H05K 5/06* | (2006.01) |
| *H05K 3/02* | (2006.01) |
| *H05K 1/18* | (2006.01) |
| *H05K 1/02* | (2006.01) |
| *H05K 3/28* | (2006.01) |

(52) U.S. Cl.
CPC .......... *H05K 1/021* (2013.01); *H05K 1/0231* (2013.01); *H05K 3/284* (2013.01); *H05K 5/065* (2013.01); *H05K 2201/01* (2013.01); *H05K 2201/10287* (2013.01); *H05K 2201/10522* (2013.01)

(58) Field of Classification Search
CPC ... H05K 2203/1327; H05K 2230/1469; H05K 1/185; H05K 3/284; H05K 5/065; H05K 2201/10977; H05K 3/0284
See application file for complete search history.

(56) References Cited

U.S. PATENT DOCUMENTS

| | | | | |
|---|---|---|---|---|
| 6,043,981 | A | * | 3/2000 | Markow ............. H01L 23/4006 165/80.3 |
| 8,895,871 | B2 | | 11/2014 | Sauerbier et al. |
| 9,596,794 | B2 | | 3/2017 | Stevens et al. |
| 9,736,952 | B2 | * | 8/2017 | Kajiwara ............... H05K 5/006 |
| 10,161,733 | B2 | * | 12/2018 | Eitschberger .......... F42D 1/045 |
| 10,317,061 | B2 | | 6/2019 | Klafta et al. |
| 10,462,921 | B2 | * | 10/2019 | Bayerer .................. H01L 23/10 |
| 10,506,732 | B2 | | 12/2019 | Wittmann et al. |
| 2009/0086431 | A1 | * | 4/2009 | Sakamoto .......... H05K 7/20009 361/695 |
| 2009/0322149 | A1 | * | 12/2009 | Kishibata ............... H05K 1/148 307/10.1 |

* cited by examiner

*Primary Examiner* — Hoa C Nguyen
(74) *Attorney, Agent, or Firm* — Snell & Wilmer L.L.P.

(57) ABSTRACT

A circuit board assembly for retrofitting a circuit board on a power drive unit (PDU) may comprise an enclosure, a circuit board disposed in the enclosure, and a potting component disposed in the enclosure. The circuit board assembly may further comprise a dielectric sheet and a backing sheet. The dielectric sheet may be disposed between the backing sheet and the printed circuit board assembly.

14 Claims, 10 Drawing Sheets

POTTED PRINTED CIRCUIT BOARD MODULE AND METHODS THEREOF

FIELD

The present disclosure is directed to cargo loading systems for aircraft and, more particularly, to a potted printed circuit board (PCB) module for a power drive unit (PDU).

BACKGROUND

Aircraft may transport at least one of passengers or cargo. Many aircraft thus have at least one cargo bay designed to receive cargo. Such cargo bays include cargo loading systems that include rollers located on a floor of the cargo bay along with power drive units (PDUs) that provide propulsion to drive a unit load device (ULD, cargo) through the cargo bay. Occasionally, moisture ingression may occur in PDUs causing issues in the field.

SUMMARY

A cargo loading system is disclosed herein. The cargo loading system may comprise: a power drive unit (PDU) including a housing; and a potted printed circuit board module, comprising: an enclosure coupled to the housing; a printed circuit board assembly disposed in the enclosure, the printed circuit board assembly comprising a plurality of electrical components in electrical communication with the PDU; and a potting component configured to be disposed in the enclosure.

In various embodiments, the enclosure comprises a slot, and wherein a plurality of wires extend through the slot. The potted printed circuit board module may further comprise a dielectric sheet disposed adjacent to the printed circuit board assembly. The potted printed circuit board module may further comprise a backing sheet, the dielectric sheet disposed between the backing sheet and the printed circuit board assembly. The backing sheet may comprise a thermally conductive material. The potted printed circuit board module may further comprise a heat sink. The potted printed circuit board module may be configured to replace an original printed circuit board assembly for the cargo loading system.

A method is disclosed herein. The method may comprise: removing a first printed circuit board assembly from a power drive unit (PDU); and coupling a potted printed circuit board module to the PDU, the potted printed circuit board module comprising an enclosure, a second printed circuit board assembly disposed within the enclosure, and a potting component disposed within the enclosure.

In various embodiments, the enclosure may comprise a slot. A plurality of wires may extend through the slot. The potted printed circuit board module may further comprise a dielectric sheet disposed adjacent to the second printed circuit board assembly. The potted printed circuit board module may further comprise a backing sheet, the dielectric sheet disposed between the backing sheet and the second printed circuit board assembly. The potted printed circuit board module may further comprise a heat sink. Coupling the potted printed circuit board module may further comprise thermally coupling the heat sink to the PDU. The first printed circuit board assembly may be substantially similar to the second printed circuit board assembly.

A method of manufacturing a potted printed circuit board module is disclosed herein. The method may comprise: disposing a dielectric sheet adjacent to a printed circuit board assembly in an enclosure through an opening of the enclosure; sealing the opening of the enclosure with a backing sheet; filling the enclosure with a potting component; and curing the potting component.

In various embodiments, filling the enclosure may further comprise disposing the potting component in liquid form through a slot of the enclosure. A plurality of wires may extend through the slot. The potting component may be configured to fill a volume within the enclosure. The dielectric sheet may be configured to insulate the printed circuit board assembly from the backing sheet.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosures, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
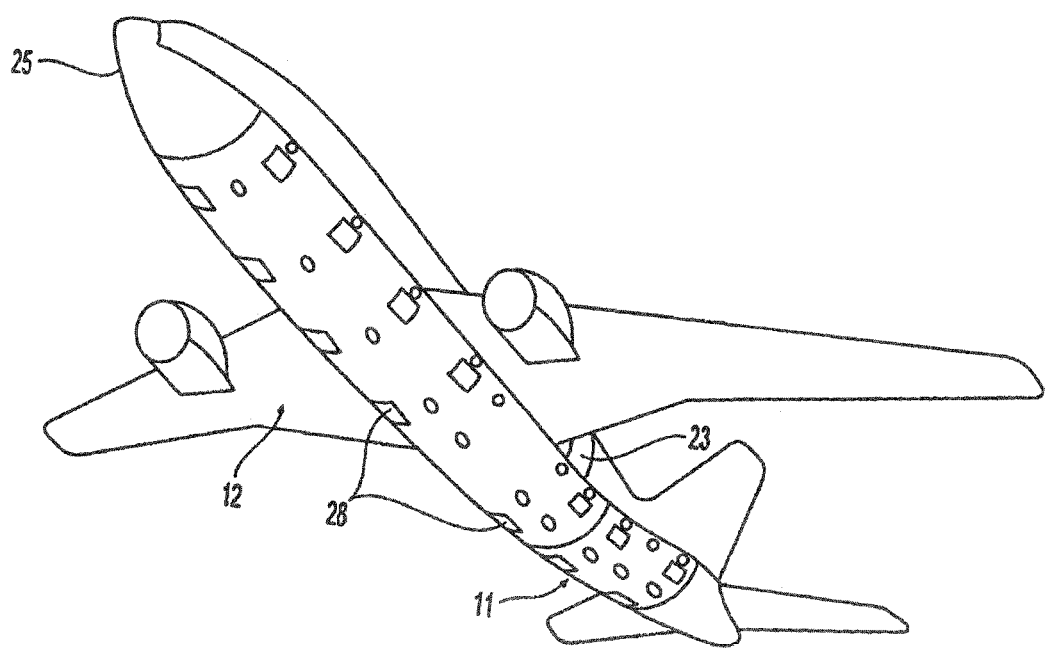
FIG. 1 illustrates an underside of an aircraft, in accordance with various embodiments.
Figure 2:
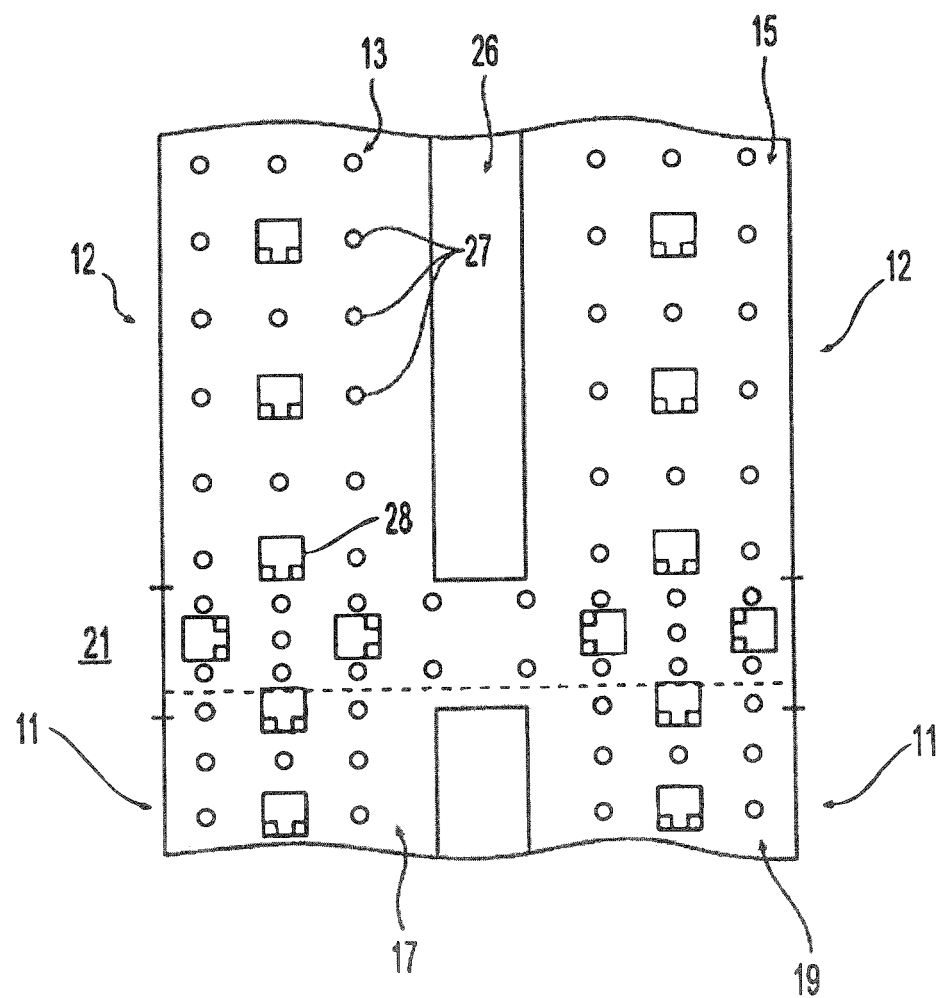
FIG. 2 illustrates an aircraft cargo deck, in accordance with various embodiments.

FIG. 1 illustrates an underside of an aircraft 25 and FIG. 2 illustrates an aircraft cargo deck 29 that can be used to implement various embodiments of the present disclosure. A generally H-shaped conveyance surface 26 forms a deck of an aircraft, adjacent a cargo bay loading door 23. However, there are many other aircraft cargo deck configurations to which the embodiments of the disclosure can be implemented. For example, various aircraft, particularly those configured primarily for the transportation of cargo without passengers, have the upper passenger deck removed and an additional larger cargo deck installed. Other aircraft may have three or more parallel longitudinal tracks rather than the H-shape shown in FIG. 2.

The cargo compartment includes a cargo loading system comprising a plurality of freely rotating conveyance rollers 27 mounted in the cargo deck to define the conveyance plane. Cargo loaded onto the aircraft cargo deck can be moved manually throughout the cargo bay upon the freely rotating conveyance rollers. However, it is desirable to electromechanically propel the cargo with minimal or no manual assistance. In that regard, the H-shaped cargo surface includes a number of power drive units (PDUs) 28 that provide a mechanism upon which cargo is propelled over the conveyance rollers 27.

In the longitudinal direction, the H-shaped conveyance surface 26 includes a left track and a right track along which cargo is to be stowed in parallel columns during flight. In the transverse direction, the cargo deck is also separated into a tail (or "aft") section 11 and a forward section 12. Thus, the left and right tracks are divided into four sections, two forward sections 13 and 15 and two aft sections 17 and 19. In addition to the four sections, there is an additional path 21 between both tracks at the cargo bay loading door 23. This additional path 21 divides the cargo bay between the forward section 12 and the aft section 11. This path is used to move cargo into and out the aircraft 25, and also to transfer cargo between the left and right storage tracks.

In various embodiments, an operator may manipulate control elements to selectively and electrically energize PDUs 28 in each of the five aforementioned sections 13, 15, 17, 19 and 21. Typically, these controls are mounted in an operator interface unit. The control elements may be mounted on a wall or other structure within the cargo bay or may be portable, e.g., the controls may be in a hand-held device. These controls will typically have an on/off switch and a joystick which, depending on the direction pushed, will energize a set of PDUs 28, causing groups of drive roller elements to be elevated (if not already elevated) and rotated in one of two possible directions (i.e., forward or reverse). A section of PDUs will remain energized as long as the joystick is held in a corresponding position. In response to release of the joystick, the selected set of PDUs is de-energized.

Figure 3:
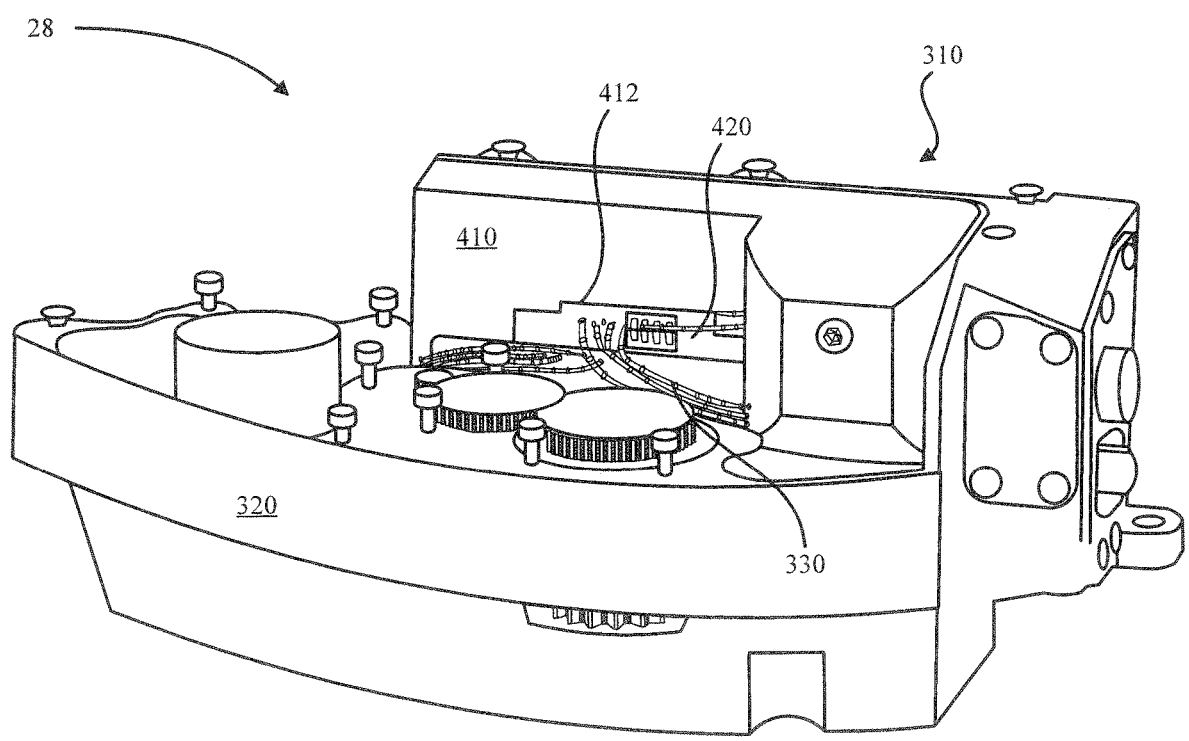
FIG. 3 illustrates a perspective view of a partially assembled view of a subassembly of a PDU, in accordance with various embodiments.

Referring now to FIG. 3, a PDU 28 this is a partially disassembled subassembly, not a full PDU is illustrated, in accordance with various embodiments. The PDU 28 comprises a housing 310 and a potted printed circuit board module 320. The potted printed circuit board module 320 is coupled to the housing by any method known in the art, such as fasteners, adhesives, or the like. The potted printed circuit board module 320 may comprise an enclosure 410 at least partially enclosing a printed circuit board assembly 420. The enclosure 410 may include a slot 412 configured to allow access to wires 330 that are coupled to the printed circuit board assembly 420. The enclosure 410 may any material known in the art, such as plastic, or the like. The enclosure 410 may at least be partially filled with a potting component. A "potting component," as described herein may be a thermoplastic elastomer, silicone, silicone rubber, natural rubber, or the like.

Figure 4:
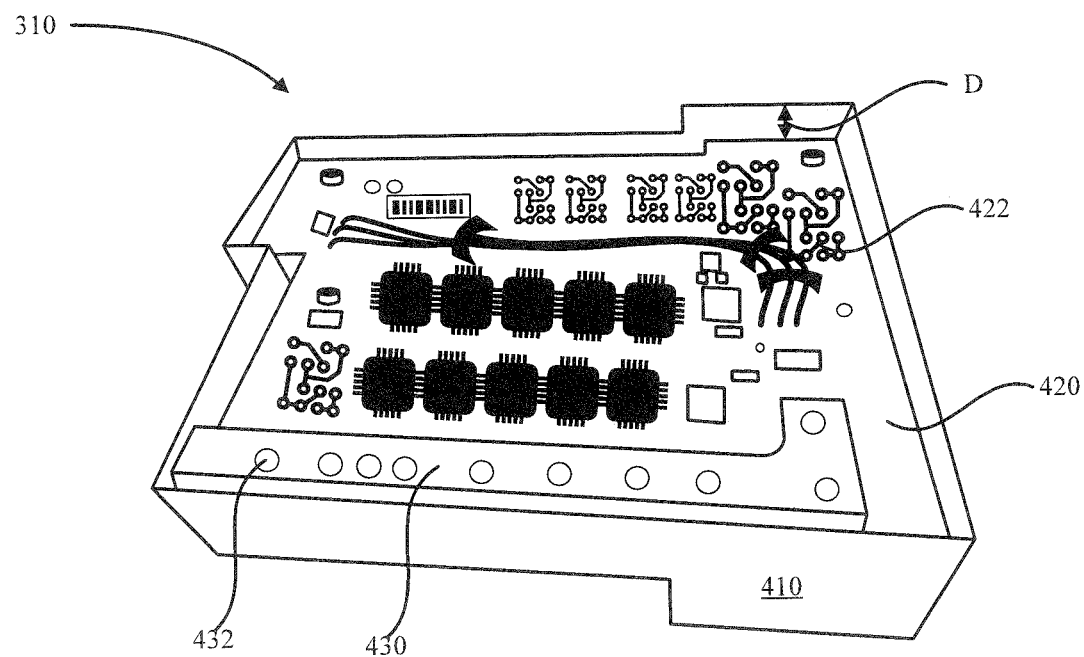
FIG. 4 illustrates a perspective view of a portion of a potted printed circuit board module, in accordance with various embodiments.

Referring now to FIG. 4, a portion of a potted printed circuit board module 320 during assembly is illustrated, in accordance with various embodiments. In various embodiments, the potted printed circuit board module 320 comprises the enclosure 410 and the printed circuit board assembly 420 disposed within the enclosure 410. The potted printed circuit board module 320 may further comprise a heat sink 430 coupled to the printed circuit board assembly 420. The heat sink 430 may be configured to absorb excessive or unwanted heat from the potted printed circuit board module 320. The heat sink 430 may comprise a plurality of apertures 432. Each aperture in the plurality of apertures 432 may be configured to receive a fastener for coupling the potted printed circuit board module 320 to a housing 310 of a PDU 28 as shown in FIG. 3. The printed circuit board assembly 420 may be disposed at a depth D within the enclosure 410. In various embodiments, a space between the printed circuit board assembly 420 and an opening of the enclosure 410 may be configured to receive a potting component therein. The printed circuit board assembly 420 may comprise a plurality of electrical components 422, such as batteries, resistors, transistors, capacitors, inductors, diodes, switches, or the like. The electrical components 422 may be coupled to the printed circuit board assembly 420 by any method known in the art, such as soldering, surface mounting, or the like.

Figure 5:
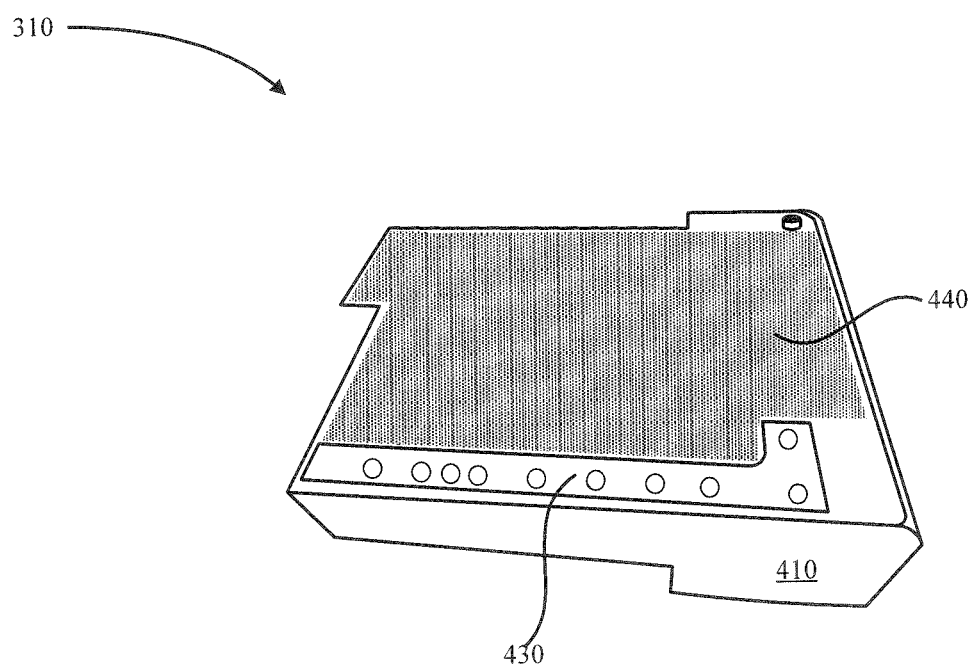
FIG. 5 illustrates a perspective view of a portion of a potted printed circuit board module, in accordance with various embodiments.

Referring now to FIG. 5, a portion of a potted printed circuit board module 320 during assembly is illustrated, in accordance with various embodiments. After the printed circuit board assembly 420 from FIG. 4 is disposed in the enclosure 410, a dielectric sheet 440 may be installed to cover the plurality of electrical components 422 from FIG. 5. The dielectric sheet 440 may be any dielectric material known in the art, such as such as polytetrafluoroethylene (PTFE), polyethylene (PE), polyimide, polypropylene, or the like. The dielectric sheet 440 may leave the heat sink 430 exposed.

Figure 6:
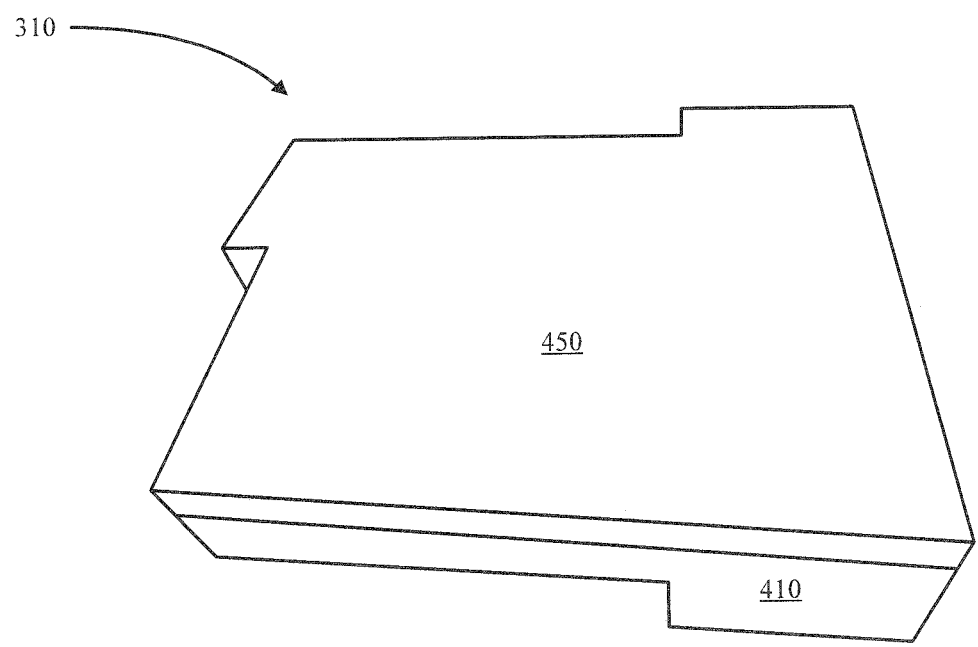
FIG. 6 illustrates a perspective view of a portion of a potted printed circuit board module, in accordance with various embodiments.

Referring now to FIG. 6, a portion of a potted printed circuit board module 320 during assembly is illustrated, in accordance with various embodiments. The potted printed circuit board module 320 may further comprise a backing sheet 450. The backing sheet 450 may be an adhesive backed metallic foil, such as aluminum foil, or any other material known in the art. The backing sheet 450 may be coupled to the enclosure 410 by an adhesive, or the like. The backing sheet 450 may extend past the walls of the enclosure 410 and/or create a seal at the opening of the enclosure 410. The backing sheet 450 may provide similar heat transfer characteristics of the housing 310 from FIG. 3. As such, heat transfer characteristics of the PDU 28 from FIG. 3 may be maintained relative to a typical PDU. The dielectric sheet 440 from FIG. 5 may allow for protection from shorting between the plurality of electrical components 422 of the printed circuit board assembly 420 from FIG. 4 and the backing sheet 450.

Figure 7:
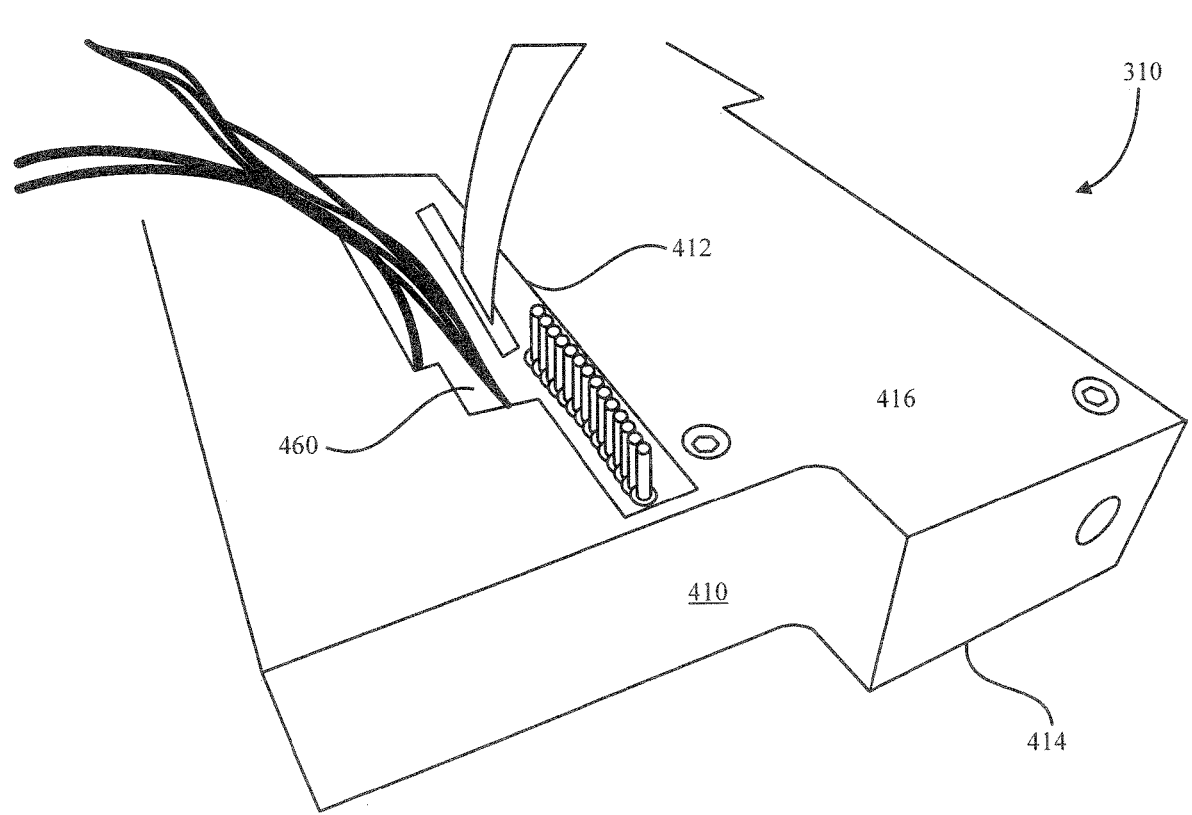
FIG. 7 illustrates a perspective view of a portion of a potted printed circuit board module, in accordance with various embodiments.

Referring now to FIG. 7, a portion of a potted printed circuit board module 320 during assembly is illustrated, in accordance with various embodiments. After the backing sheet 450 seals the opening on a first side 414 of the enclosure 410, fluid may only enter or exit the enclosure from slot 412. As such, during manufacture of the potted printed circuit board module 320, after the backing sheet 450 seals the opening on the first side 414 of the enclosure 410, a potting component 460 may be disposed in the slot 412 in a liquid form. The potting component 460 may fill an entire volume within the enclosure 410 and be substantially flush with second side 416 of the enclosure 410. The potting component 460 may then be cured. In various embodiments, the potting component 460 is made of silicone rubber, or the like. The potting component 460 may act as an adhesive and bond to the plurality of electrical components 422 of the printed circuit board assembly 420, the enclosure 410, the dielectric sheet 440, and the backing sheet 450.

Figure 8:
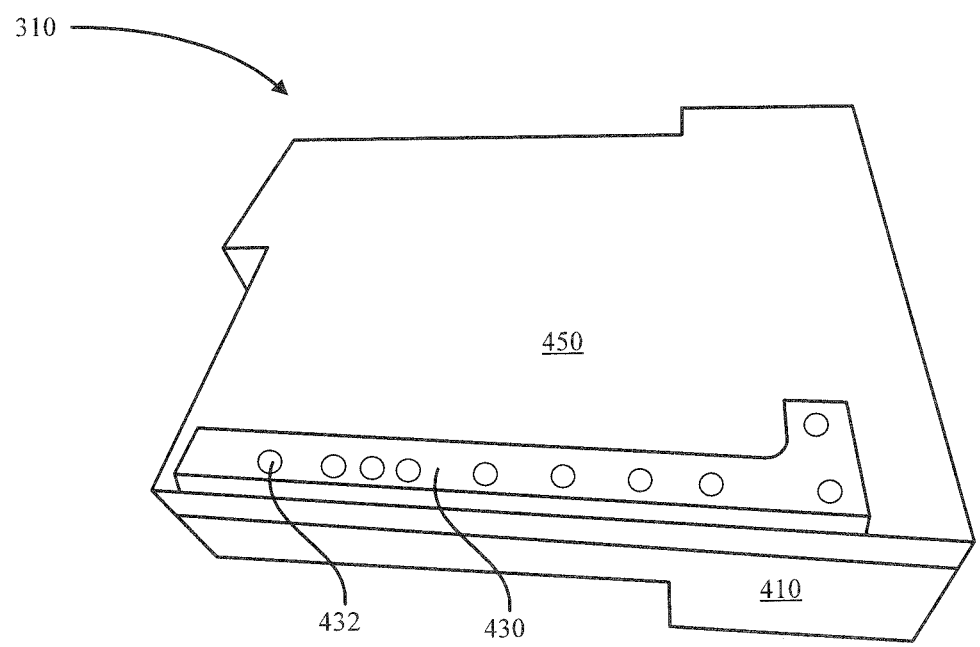
FIG. 8 a perspective view of a potted printed circuit board module, in accordance with various embodiments.

Referring now to FIG. 8, potted printed circuit board module 320 after assembly is illustrated, in accordance with various embodiments. After the potting component 460 from FIG. 7 is cured, a portion of the backing sheet 450 may be cut to expose the heat sink 430. The heat sink 430 may be exposed to facilitate installation of the potted printed circuit board module 320 on the housing 310 of the PDU 28 from FIG. 3. In this regard, the plurality of apertures 432 may be exposed and configured to receive a fastener to couple the potted printed circuit board module 320 to the PDU 28.

In various embodiments, by utilizing a potted printed circuit board module 320 with a housing of a PDU 28, a weight of the PDU 28 may be reduce relative to potting the "entire" housing 310 of the PDU. In various embodiments, a potted printed circuit board module 320 may be configured to be retro-fitted to a PDU having a printed circuit board only. In various embodiments, the backing sheet 450 may include the same material as the heat sink 430. As such, in various embodiments, the backing sheet 450 may continuously cover the heat sink 430, as illustrated in FIG. 6. In various embodiments, the potted circuit board module 320 may be coupled to the housing of a PDU 28 at another location other than the heat sink 430.

Figure 9:
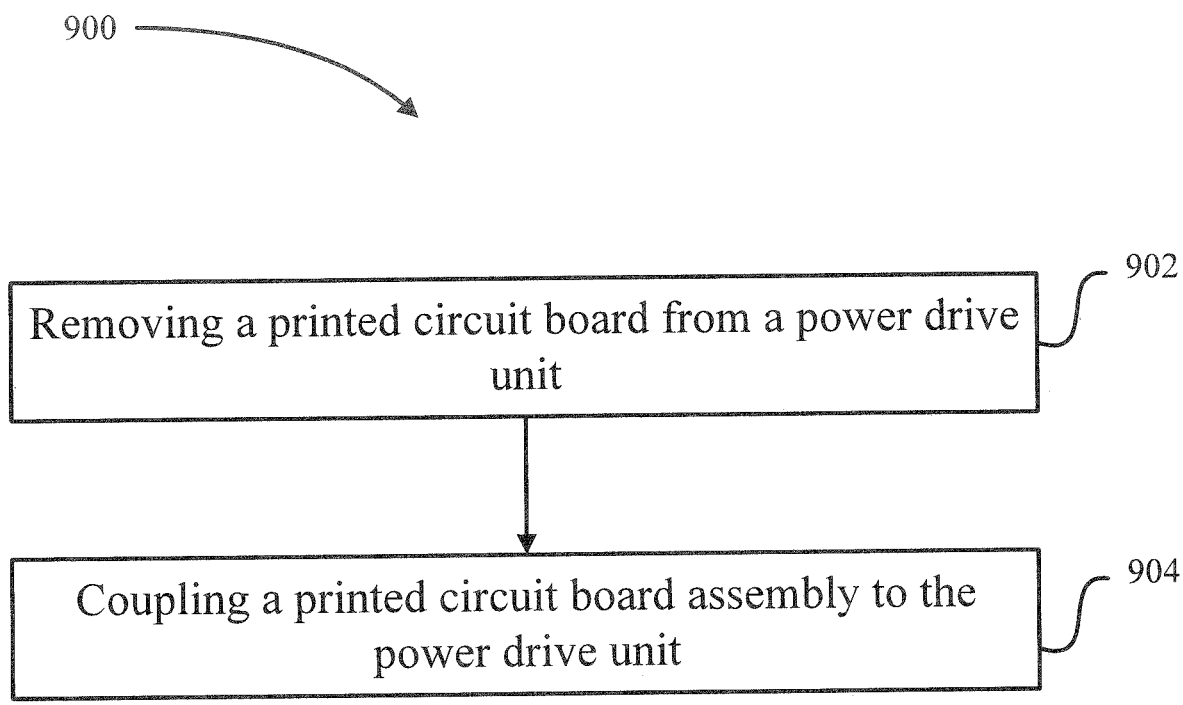
FIG. 9 illustrates a method of retrofitting a printed circuit board assembly with a potted printed circuit board module, in accordance with various embodiments.

Referring now to FIG. 9, a method 900 of retrofitting a PDU with a potted printed circuit board module is illustrated, in accordance with various embodiments. The method 900 may comprise removing a printed circuit board assembly form a power drive unit (step 902). The printed circuit board assembly may be coupled to the PDU via fasteners, or the like. The fasteners may be removed and the printed circuit board assembly may be de-coupled form the PDU. The method 900 may further comprise coupling a potted printed circuit board module to the PDU. The potted printed circuit board module may be in accordance with potted printed circuit board module 320. The potted printed circuit board module 320 may be coupled to a housing 310 of the PDU via fasteners, or the like. In various embodiments, by replacing a printed circuit board assembly of a PDU with a potted printed circuit board module, as disclosed herein, the printed circuit board assembly may experience enhanced moisture and/or vibration protection during operation of the PDU in a cargo loading system. In various embodiments, the printed circuit board assembly from step 902 may be substantially similar to the printed circuit board assembly from step 904 (i.e., the printed circuit board assembly may be substantially unchanged).

Figure 10:
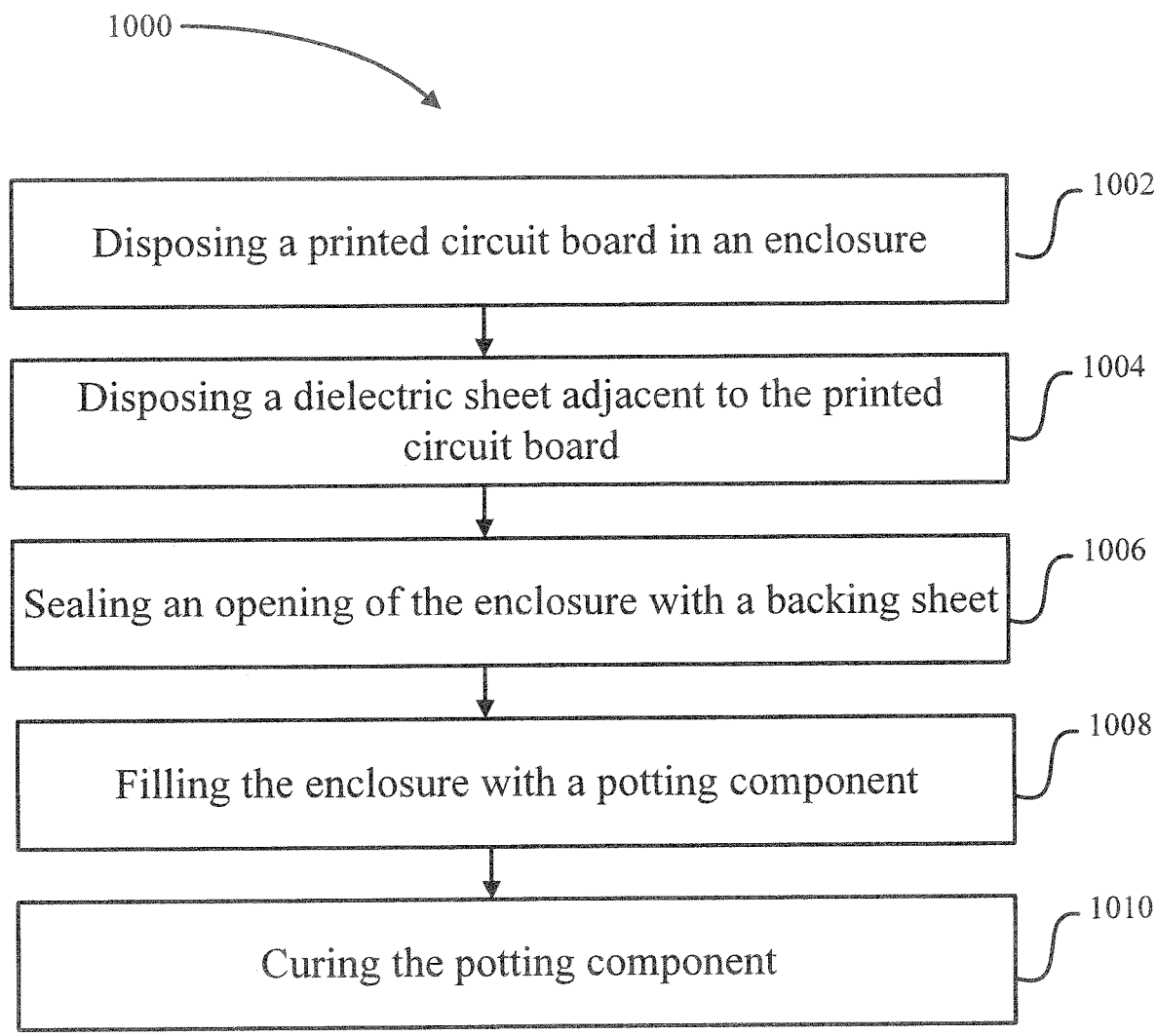
FIG. 10 illustrates a method of manufacturing a potted printed circuit board module, in accordance with various embodiments.

Referring now to FIG. 10, a method 1000 of manufacturing a potted printed circuit board module, in accordance with various embodiments, is illustrated. The method 1000 may comprise disposing a printed circuit board assembly in an enclosure (step 1002). The printed circuit board assembly may be disposed at a depth from an opening of the enclosure. The method 1000 may further comprise disposing a dielectric sheet adjacent to the printed circuit board assembly (step 1004). The dielectric sheet may be configured to cover a plurality of electrical components of the printed circuit board assembly.

The method 1000 may further comprise sealing the enclosure with a backing sheet (step 1006). The backing sheet may comprise a thermally conductive component, such as aluminum foil, or the like. The dielectric sheet may insulate the plurality of electrical components from the backing sheet. The backing sheet may seal the opening of the enclosure. The method 1000 may further comprise filling the enclosure with a potting component (step 1008). The potting component may be in liquid form during step 1008. The potting component may be disposed through a slot in the enclosure. Wires may extend from the slot and be configured to interface with components of a PDU.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A cargo loading system, comprising:
a power drive unit (PDU) including a housing; and
a potted printed circuit board module, comprising:
an enclosure coupled to the housing;
a printed circuit board assembly disposed in the enclosure, the printed circuit board assembly comprising a plurality of electrical components in electrical communication with the PDU;
a dielectric sheet disposed adjacent to the enclosure, the enclosure and the dielectric sheet defining a cavity; and
a potting component disposed in the cavity.

2. The cargo loading system of claim 1, wherein the enclosure comprises a slot, and wherein a plurality of wires extend through the slot.

3. The cargo loading system of claim 1, wherein the potted printed circuit board module further comprises a backing sheet, the dielectric sheet disposed between the backing sheet and the printed circuit board assembly.

4. The cargo loading system of claim 3, wherein the backing sheet comprises a thermally conductive material.

5. The cargo loading system of claim 3, wherein the potted printed circuit board module further comprises a heat sink.

6. The cargo loading system of claim 1, wherein the potted printed circuit board module is configured to replace an original printed circuit board assembly for the cargo loading system.

7. A method, comprising:
removing a first printed circuit board assembly from a power drive unit (PDU), the PDU including a housing; and
coupling a potted printed circuit board module to the PDU, the potted printed circuit board module comprising an enclosure, a second printed circuit board assembly disposed within the enclosure, a dielectric sheet disposed adjacent to the enclosure, the dielectric sheet and the enclosure defining a cavity, a potting component disposed within the cavity, and a plurality of electrical wires at least partially disposed within the enclosure; and
coupling the plurality of electrical wires to the PDU.

8. The method of claim 7, wherein the enclosure comprises a slot, the plurality of electrical wires extending through the slot.

9. The method of claim 8, wherein the plurality of electrical wires extend through the slot.

10. The method of claim 7, wherein the potted printed circuit board module further comprises the dielectric sheet disposed adjacent to the second printed circuit board assembly.

11. The method of claim 10, wherein the potted printed circuit board module further comprises a backing sheet, the dielectric sheet disposed between the backing sheet and the second printed circuit board assembly.

12. The method of claim 11, wherein the potted printed circuit board module further comprises a heat sink.

13. The method of claim 12, wherein coupling the potted printed circuit board module to the PDU further comprises thermally coupling the heat sink to the PDU.

14. The method of claim 7, wherein the first printed circuit board assembly is substantially similar to the second printed circuit board assembly.

* * * * *